US012633368B2

(12) United States Patent
Wu et al.

(10) Patent No.: US 12,633,368 B2
(45) **Date of Patent: \*May 19, 2026**

(54) METHOD OF TESTING A MEMORY CIRCUIT AND MEMORY CIRCUIT

(71) Applicant: TAIWAN SEMICONDUCTOR MANUFACTURING COMPANY, LTD., Hsinchu (TW)

(72) Inventors: Chao-I Wu, Hsinchu (TW); Shih-Lien Linus Lu, Hsinchu (TW); Sai-Hooi Yeong, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/789,557

(22) Filed: Jul. 30, 2024

(65) Prior Publication Data

US 2024/0386982 A1 Nov. 21, 2024

Related U.S. Application Data

(63) Continuation of application No. 18/362,934, filed on Jul. 31, 2023, now Pat. No. 12,106,814, which is a
(Continued)

(51) Int. Cl.
*G11C 29/38* (2006.01)
*G06F 11/20* (2006.01)
(Continued)

(52) U.S. Cl.
CPC .......... *G11C 29/38* (2013.01); *G06F 11/2094* (2013.01); *G11C 16/08* (2013.01); *G11C 16/10* (2013.01); *G11C 16/26* (2013.01)

(58) Field of Classification Search
None
See application file for complete search history.

(56) References Cited

U.S. PATENT DOCUMENTS 9,087,556 B2 7/2015 Leedy
11,749,370 B2 * 9/2023 Wu ........................ G11C 29/38
714/719
(Continued)

FOREIGN PATENT DOCUMENTS

KR 10-2005-0110680 11/2005
KR 20160145797 12/2016
WO 2015199837 12/2015

OTHER PUBLICATIONS

Office Action dated Oct. 19, 2021 for corresponding case No. TW 11021012260. (pp. 1-4).

*Primary Examiner* — Guerrier Merant
(74) *Attorney, Agent, or Firm* — Hauptman Ham, LLP

(57) ABSTRACT

A method of testing a three dimensional (3D) memory cell array includes applying a first voltage to word lines of each layer of memory cells in the 3D memory cell array thereby performing a write operation of the 3D memory cell array, simultaneously performing a read operation of each memory cell in a first layer of the 3D memory cell array, determining that each memory cell in the first layer has not failed in response to the read operation, and not replacing at least one failed memory cell in the first layer with a first spare memory cell. The simultaneously performing the read operation of each memory cell in the first layer includes comparing a first total read current of each memory cell in the first layer with a first expected read current of each memory cell in the first layer.

20 Claims, 8 Drawing Sheets

Related U.S. Application Data continuation of application No. 17/198,898, filed on Mar. 11, 2021, now Pat. No. 11,749,370.

(60) Provisional application No. 63/031,863, filed on May 29, 2020.

(51) Int. Cl.
*G11C 16/08* (2006.01)
*G11C 16/10* (2006.01)
*G11C 16/26* (2006.01)

(56) References Cited

U.S. PATENT DOCUMENTS

| | | | | |
|---|---|---|---|---|
| 12,106,814 | B2 * | 10/2024 | Wu | .......................... G11C 16/10 |
| 2003/0043643 | A1 | 3/2003 | Scheuerlein et al. | |
| 2017/0352415 | A1 | 12/2017 | Harvard | |

* cited by examiner

700

METHOD OF TESTING A MEMORY CIRCUIT AND MEMORY CIRCUIT

PRIORITY CLAIM

The present application is a continuation of U.S. application Ser. No. 18/362,934, filed Jul. 31, 2023, now U.S. Pat. No. 12,106,814, issued on Oct. 1, 2024, which is a continuation of U.S. application Ser. No. 17/198,898, filed Mar. 11, 2021, now U.S. Pat. No. 11,749,370, issued Sep. 5, 2023, and which claims the benefit of U.S. Provisional Application No. 63/031,863, filed May 29, 2020, which are herein incorporated by reference in their entireties.

BACKGROUND

The semiconductor integrated circuit (IC) industry has produced a wide variety of digital devices to address issues in a number of different areas. Some of these digital devices, such as memory macros, are configured for the storage of data. As ICs have become smaller and more complex, the resistance of conductive lines within these digital devices are also changed affecting the operating voltages of these digital devices and overall IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
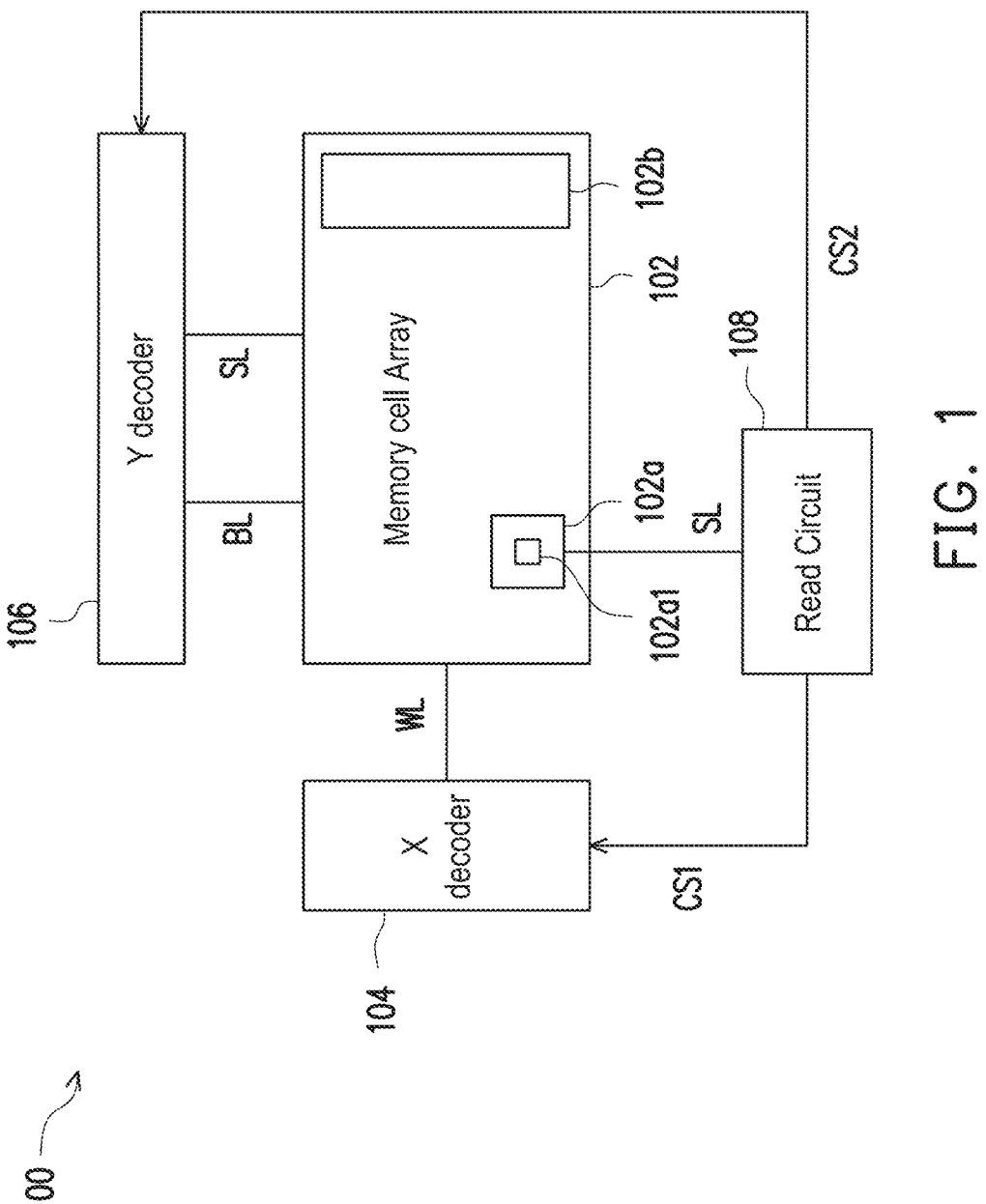
FIG. 1 is a circuit diagram of a memory circuit, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a method of testing a three dimensional (3D) memory cell array includes simultaneously writing data to each layer of memory cells in the 3D memory cell array and simultaneously performing a read operation of each memory cell in each layer in the 3D memory cell array.

In some embodiments, the method of testing the 3D memory cell array further includes determining whether a memory cell in the 3D memory cell array has failed in response to the read operation, and replacing at least one failed memory cell in the 3D memory cell array with a spare memory cell in response to determining that the memory cell in the 3D memory cell array has failed.

In some embodiments, by simultaneously writing data to each layer of memory cells in the 3D memory cell array, testing time on the 3D memory cell array is reduced compared with other approaches thereby improving testing efficiency.

In some embodiments, by simultaneously performing a read operation of each memory cell in each layer in the 3D memory cell array, testing time on the 3D memory cell array is reduced compared with other approaches thereby improving testing efficiency.

FIG. 1 is a circuit diagram of a memory circuit 100, in accordance with some embodiments. In the embodiment of FIG. 1, integrated circuit 100 is a memory macro.

Memory circuit 100 includes a memory cell array 102, an X-decoder circuit 104, a Y-decoder circuit 106 and a read circuit 108. Memory cell array 102 is coupled to X-decoder circuit 104 by word lines WL. Memory cell array 102 is coupled to Y-decoder circuit 104 by at least bit lines BL or source lines SL. Memory cell array 102 is coupled to read circuit 108. In some embodiments, memory cell array 102 is coupled to read circuit 108 by at least bit lines BL or source lines SL.

Figure 2:
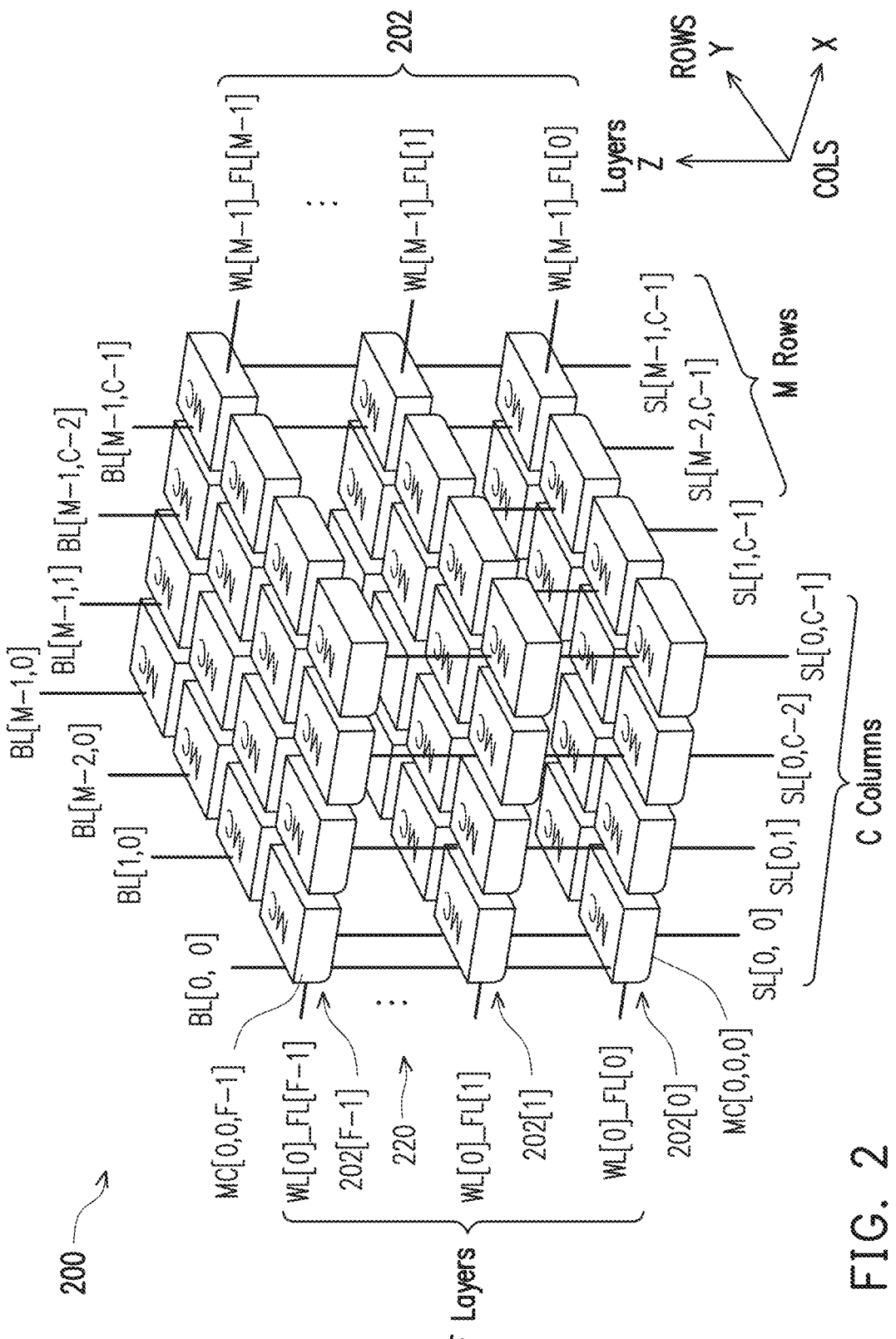
FIG. 2 is a perspective view of a memory circuit, in accordance with some embodiments.

Memory cell array 102 comprises a three-dimensional (3D) array of memory cells having M rows, C columns and F layers, where M, C and F are positive integers (shown in FIG. 2).

Memory cell array 102 includes a memory cell array 102a and a spare memory cell array 102b. Memory cell array 102a includes one or more rows and one or more columns of memory cells on one or more layers. Spare memory cell array 102b includes one or more rows and one or more columns of spare memory cells on one or more layers. In some embodiments, a spare memory cell is a redundant memory cell. In some embodiments, a spare memory cell is initially configured to not store data, but may be changed to store data afterwards. For example, in some embodiments, a spare memory cell is initially configured to not store data prior to testing of memory cell array 102. In some embodiments, after testing of memory cell array 102, one or more spare memory cells replace one or more corresponding memory cells that fail testing, and thus are configured to store data.

Memory cell array 102a is shown with a single memory cell 102a1 coupled to the read circuit 108 for brevity and ease of illustration. However, each memory cell in memory cell array 102a and each spare memory cell in spare memory cell array 102b is coupled to the read circuit 108. In some embodiments, each memory cell in memory cell array 102a is coupled to the read circuit 108 by at least a corresponding source line or a corresponding bit line, and each spare memory cell in spare memory cell array 102b is coupled to the read circuit 108 by at least a corresponding source line or a corresponding bit line.

In some embodiments, each memory cell in memory cell array 102a is configured to store 1 bit of data. In some embodiments, each memory cell in memory cell array 102a is configured to store more than a 1 bit of data. In some embodiments, each spare memory cell in spare memory cell array 102b is capable of being configured to store 1 bit of data. In some embodiments, each spare memory cell in spare memory cell array 102b is capable of being configured to store more than a 1 bit of data.

In some embodiments, memory cell array 102 is a non-volatile random-access memory (NVRAM) array. In some embodiments, each memory cell in memory cell array 102 corresponds to a FLASH memory cell. In some embodiments, each memory cell in memory cell array 102 corresponds to a NOR memory cell. In some embodiments, each memory cell in memory cell array 102 corresponds to a NAND memory cell.

Different types of memory cells in memory cell array 102 are within the contemplated scope of the present disclosure. For example, in some embodiments, each memory cell in memory cell array 102 is a magneto-resistive random-access memory (MRAM). In some embodiments, each memory cell in memory cell array 102 corresponds to a ferroelectric random access memory (FeRAM) cell. In some embodiments, each memory cell in memory cell array 102 corresponds to a ferroelectric field effect transistor (FeFET) cell. In some embodiments, each memory cell in memory cell array 102 corresponds to a phase-change random access memory (PCRAM) cell. In some embodiments, each memory cell in memory cell array 102 corresponds to a resistive random-access memory (RRAM) cell. In some embodiments, each memory cell in memory cell array 102 corresponds to a dynamic random-access memory (DRAM) cell. In some embodiments, each memory cell in memory cell array 102 corresponds to a one-time programmable (OTP) memory cell. In some embodiments, each memory cell in memory cell array 102 corresponds to a static random access memory (SRAM) cell. Other configurations of memory cell array 102 are within the scope of the present disclosure.

X-decoder circuit 104 is coupled to memory cell array 102 and read circuit 108. In some embodiments, X-decoder circuit 104 is not coupled to read circuit 108. X-decoder circuit 104 is configured to generate word line signals (not shown) on corresponding word lines WL to memory cell array 102. In some embodiments, X-decoder circuit 104 includes word line driver circuits (not shown) coupled to the word lines WL, and the word line driver circuits (not shown) are configured to generate the word line signals that are sent to memory cell array 102.

In some embodiments, word line driver circuits (not shown) decode a row address of a memory cell in memory cell array 102 that is selected to be accessed in a read operation, a write operation or an erase operation. In some embodiments, the word line driver circuits (not shown) then supply a voltage to the selected word line corresponding to the decoded row address, and a different voltage to the other, unselected word lines.

In some embodiments, X-decoder circuit 104 is configured to receive a set of control signals CS1 from read circuit 108. In some embodiments, the X-decoder circuit 104 is configured to generate the word line signals in response to the set of control signals CS1 from read circuit 108. Other configurations of X-decoder circuit 104 are within the scope of the present disclosure.

Y-decoder circuit 106 is coupled to memory cell array 102 and read circuit 108. In some embodiments, Y-decoder circuit 106 is not coupled to read circuit 108. Y-decoder circuit 106 is configured to generate bit line signals (not shown) on corresponding bit lines BL to memory cell array 102, and configured to generate source line signals (not shown) on corresponding source lines SL to memory cell array 102.

In some embodiments, Y-decoder circuit 106 includes bit line driver circuits (not shown) coupled to the bit lines BL, and the bit line driver circuits (not shown) are configured to generate the bit line signals that are sent to memory cell array 102. In some embodiments, Y-decoder circuit 106 includes source line driver circuits (not shown) coupled to the source lines SL, and the bit line driver circuits (not shown) are configured to generate the source line signals that are sent to memory cell array 102.

In some embodiments, bit line driver circuits (not shown) decode a column address of a memory cell in memory cell array 102 selected to be accessed in a read operation, a write operation or an erase operation. In some embodiments, bit line driver circuits (not shown) then supply a voltage to the selected bit line corresponding to the decoded column address, and a different voltage to the other, unselected bit lines.

In some embodiments, source line driver circuits (not shown) supply a voltage to the selected source line corresponding to the selected memory cell in memory cell array 102, and a different voltage to the other, unselected source lines.

In some embodiments, Y-decoder circuit 106 is configured to receive a set of control signals CS2 from read circuit 108. In some embodiments, the Y-decoder circuit 106 is configured to generate at least the bit line signals or the source line signals in response to the set of control signals CS2 from read circuit 108. Other configurations of Y-decoder circuit 106 are within the scope of the present disclosure.

In some embodiments, the X-decoder circuit 104 and the Y-decoder circuit 106 are configured to simultaneously perform a write operation of each memory cell in each layer of memory cell array 102. Stated differently, in some embodiments, the X-decoder circuit 104 and the Y-decoder circuit 106 are configured to write data to each memory cell in each layer of memory cell array 102 at the same time.

Read circuit 108 is coupled to memory cell array 102, X-decoder circuit 104 and Y-decoder circuit 106. Read circuit 108 is configured to read data stored in memory cell array 102. In some embodiments, read circuit 108 includes one or more sense amplifiers configured to read data stored in memory cell array 102. In some embodiments, system 800 corresponds to a sense amplifier.

In some embodiments, read circuit 108 is configured to perform testing of memory cell array 102. In some embodiments, read circuit 108 is configured to generate the set of control signals CS1 and the set of control signals CS2. In some embodiments, during testing of memory cell array 102, read circuit 108 is configured to determine failed memory cells in memory cell array 102a, and replaces the failed memory cells in memory cell array 102a with corresponding spare memory cells in spare memory cell array 102b. In some embodiments, the failed memory cells are identified by read circuit 108 by measuring the read current of each layer in memory cell array 102a during a read operation.

In some embodiments, read circuit 108 is configured to simultaneously perform a read operation of each memory cell in each layer of memory cell array 102 or 202 (FIG. 2). Stated differently, in some embodiments, the read circuit 108 is configured to read data from each memory cell in each layer of memory cell array 102 or 202 at the same time.

In some embodiments, read circuit 108 is configured to simultaneously perform a read operation of each memory cell in a single layer of memory cell array 102 or 202. Stated differently, in some embodiments, the read circuit 108 is configured to read data from each memory cell in a single layer of memory cell array 102 or 202 at the same time.

In some embodiments, by memory circuit 100 simultaneously performing a write operation of each memory cell in each layer of memory cell array 102, testing time on memory cell array 102 is reduced compared with other approaches.

In some embodiments, by memory circuit 100 simultaneously performing a read operation of each memory cell in each layer of memory cell array 102, testing time on memory cell array 102 is reduced compared with other approaches.

In some embodiments, two or more of at least X-decoder circuit 104, Y-decoder circuit 106 and read circuit 108 are combined into a single peripheral circuit. Other configurations of read circuit 108 are within the scope of the present disclosure.

Other configurations of memory circuit 100 are within the scope of the present disclosure.

FIG. 2 is a perspective view of a memory circuit 200, in accordance with some embodiments.

Memory circuit 200 relates to memory circuit 100 of FIG. 1. Memory circuit 200 is an embodiment of memory cell array 102, and similar detailed description is omitted.

Components that are the same or similar to those in one or more of FIGS. 1-8 (shown below) are given the same reference numbers, and detailed description thereof is thus omitted. In some embodiments, FIGS. 1-8 include additional elements not shown in FIGS. 1-8.

Memory circuit 200 includes a memory cell array 202. Memory cell array 202 comprises a three dimensional (3D) array of memory cells having M rows and C columns, and arranged on F layers of memory circuit 200, where M, C and F are positive integers. In some embodiments, memory cell array 202 is an embodiment of memory cell array 102, and similar detailed description is omitted.

The columns C of memory cells (collectively referred to as "memory cells MC") in memory cell array 202 are arranged in a first direction Y. The rows R of memory cells MC in memory cell array 202 are arranged in a second direction X. The layers F of memory cells MC in memory cell array 202 are arranged in a third direction Z.

At least one of the first direction Y, the second direction X or the third direction Z is different from another of at least the first direction Y, the second direction X or the third direction Z. In some embodiments, at least one of the first direction Y, the second direction X or the third direction Z is perpendicular to another of at least the first direction Y, the second direction X or the third direction Z.

Memory cell array 202 comprises memory cell arrays 202[0], . . . , 202[F-1] arranged on a corresponding layer 0, . . . , F-1 of layers F of memory cell array 202. For example, each memory cell array 202[0], . . . , 202[F-1] includes an array of memory cells MC arranged on a corresponding layer 0, . . . , F-1 of layers F. Memory cell arrays 202 herein are denoted by 202[layer or floor number].

Each memory cell array 202[0], . . . , 202[F-1] of memory cell array 202 is separated from another memory cell array 202[0], . . . , 202[F-1] of memory cell array 202 in the third direction Z by an insulating region 220.

Each memory cell array 202[0], . . . , 202[F-1] of memory cell array 202 includes an array of memory cells MC[0, 0, layer], MC[1, 0, layer], . . . , MC[C-1, 0, layer], . . . , MC[0, M-1, layer], MC[1, M-1, layer], . . . , MC[C-1, M-1, layer] having M rows, and C columns on a corresponding layer 0, . . . , F-1 of layers F. Memory cells MC herein are denoted by MC[column number, row number, layer or floor number]. For example, memory cell array 202[0] includes an array of memory cells MC[0, 0, 0], MC[1, 0, 0], . . . , MC[C-1, 0, 0], . . . , MC[0, M-1, 0], MC[1, M-1, 0], . . . , MC[C-1, M-1, 0] on corresponding layer 0.

The rows of memory cells MC in each memory cell array 202[0], . . . , 202[F-1] are arranged in the second direction X. The columns of cells in each memory cell array 202[0], . . . , 202[F-1] are arranged in the first direction Y. In some embodiments, each memory cell MC in memory cell array 202 is configured to store a corresponding bit of data. In some embodiments, each memory cell MC in memory cell array 202 is configured to store more than a corresponding bit of data.

In some embodiments, at least one memory cell array 202[0], . . . , 202[F-1] of memory cell array 202 is the same as at least another memory cell array 202[0], . . . , 202[F-1] of memory cell array 202. In some embodiments, at least one memory cell array 202[0], . . . , 202[F-1] of memory cell array 202 is different from at least another memory cell array 202[0], . . . , 202[F-1] of memory cell array 202.

In some embodiments, a pillar includes memory cells in each layer of memory cell array 202 within a specific row and a specific column. For example, a pillar (not labelled) in the third direction Z positioned in row 0 and column 0 of memory circuit 200 corresponds to memory cells 202[0,0,0], 202[0,0,1], . . . , 202[0,0,F-1] in row 0 and column 0 of each layer of memory cell array 202.

Each memory cell array in each corresponding layer of memory cell array 202 further includes M word lines (collectively referred to as "word lines WL") extending in the second direction X. Word lines WL herein are denoted by WL[row number]_FL[floor number]. Within each layer of memory cell array 202, M word lines are coupled to a corresponding row of memory cells of memory cell array 202[0], . . . , 202[F-1]. For example, memory cell array 202[0] further includes M word lines WL[0]_FL[0], WL[1]_FL[0] . . . , WL[M-1]_FL[0] coupled to a corresponding row of memory cells in layer 0 of memory cell array 202. Similarly, memory cell array 202[F-1] further includes M word lines WL[0]_FL[F-1], WL[1]_FL[F-1] . . . , WL[M-1]_FL[F-1] coupled to a corresponding row of memory cells in layer F-1 of memory cell array 202. Memory cell array 202 has F*M word lines WL.

Each row of memory cells in memory cell array 202[0] is associated with a corresponding word line of word lines WL[0]_FL[0], WL[1]_FL[0] . . . , WL[M-1]_FL[0] in layer 0 of memory cell array 202. Similarly, each row of memory cells in memory cell array 202[F-1] is associated with a corresponding word line of word lines WL[0]_FL[F-1], WL[1]_FL[F-1] . . . , WL[M-1]_FL[F-1] in layer F-1 of memory cell array 202. Other configurations of word lines WL are within the scope of the present disclosure.

Memory cell array 202 further includes bit lines BL[0, 0], BL[1, 0], . . . , BL[C-1, 0], . . . , BL[0, M-1], BL[1, M-1], . . . , BL[C-1, M-1] (collectively referred to as "bit lines BL") coupled to a corresponding column and a corresponding row of memory cells in memory cell array 202. Bit lines BL herein are denoted by BL[column number, row number]. For ease of illustration, some of the bit lines in memory cell array 202 are not shown in FIG. 2. Memory cell array 202 has C*M bit lines BL. In some embodiments, bit lines BL are also referred to as local bit lines.

Each column and each row in memory cell array 202 is associated with a corresponding bit line. Each bit line BL extends in the third direction Z. Bit lines BL electrically couple corresponding memory cells located on different layers of memory cell array 202 to each other. For example, each memory cell in row 0 and column 0 of memory cell array 202 is electrically coupled together by bit line BL[0, 0]. Similarly, each memory cell in row M-1 and column C-1 of memory cell array 202 is electrically coupled together by bit line BL[C-1, M-1]. Other configurations of bit lines BL are within the scope of the present disclosure.

Memory cell array 202 further includes source lines SL[0, 0], SL[1, 0], . . . , SL[C-1, 0], . . . , SL[0, M-1], SL[1, M-1], . . . , SL[C-1, M-1] (collectively referred to as "source lines SL") coupled to a corresponding column and a corresponding row of memory cells in memory cell array 202. Source lines SL herein are denoted by SL[column number, row number]. For ease of illustration, some of the source lines in memory cell array 202 are not shown in FIG. 2. Memory cell array 202 has C*M source lines SL. In some embodiments, source lines SL are also referred to as local source lines.

Each column and each row in memory cell array 202 is associated with a corresponding source line. Each source line SL extends in the third direction Z. Source lines SL electrically couple corresponding memory cells located on different layers of memory cell array 202 to each other. For example, each memory cell in row 0 and column 0 of memory cell array 202 is electrically coupled together by source line SL[0, 0]. Similarly, each memory cell in row M-1 and column C-1 of memory cell array 202 is electrically coupled together by source line SL[C-1, M-1]. Other configurations of source lines SL are within the scope of the present disclosure.

Other configurations of memory cell array 202 are within the scope of the present disclosure. In some embodiments, at least the bit lines BL or the source lines SL extend in the first direction Y instead of the third direction Z. In some embodiments, where the bit lines BL of each layer extend in the first direction Y, the bit lines BL of each layer are electrically coupled together by one or more conductive structures (not shown) extending in the third direction Z. In some embodiments, where the source lines SL of each layer extend in the first direction Y, the bit lines SL of each layer are electrically coupled together by one or more conductive structures (not shown) extending in the third direction Z.

Other configurations of memory circuit 200 are within the scope of the present disclosure. In some embodiments, memory cell array 202 is a NAND memory cell array, and memory circuit 200 further includes a bit-line select transistor array (not shown) above floor F and a ground select transistor array (not shown) below floor 0. In these embodiments, the details of bit-line select transistor array (not shown) above floor F and a ground select transistor array (not shown) below floor 0 are similar to the details of memory cell array 202, and similar description is omitted for brevity.

Figure 3:
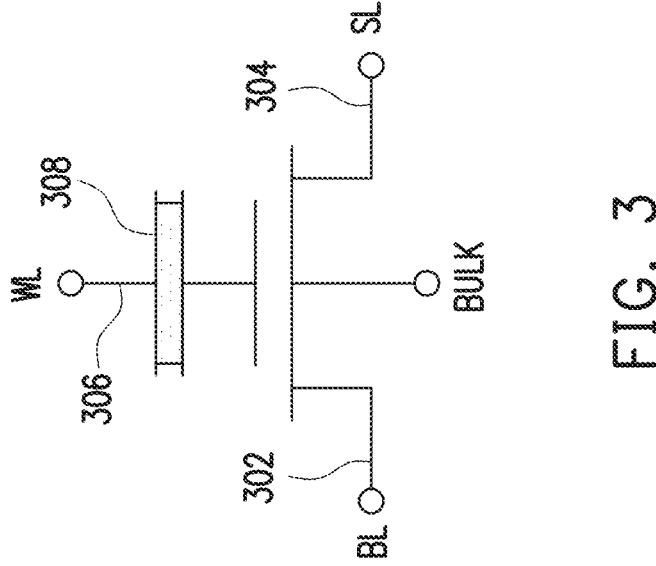
FIG. 3 is a circuit diagram of a memory cell, in accordance with some embodiments.

FIG. 3 is a circuit diagram of a memory cell 300, in accordance with some embodiments.

Memory cell 300 is an embodiment of one or more memory cells in at least memory cell array 102 or 202, and similar detailed description is therefore omitted.

Memory cell 300 includes a first terminal 302 coupled to a bit line BL, a second terminal 304 coupled to a source line SL, and a control terminal 306 coupled to a word line WL by a coupling capacitor 308. In some embodiments, the coupling capacitor 308 is omitted. In some embodiments, a substrate of the memory cell 300 is biased with a voltage BULK. In some embodiments, the voltage BULK is ground or VSS.

In some embodiments, memory cell 300 corresponds to one of the memory cells MC in memory cell array 102 or 202, bit line BL corresponds to one of the bit lines BL[0,0], . . . , BL[M-1,C-1], source line SL corresponds to one of the source lines SL[0,0], . . . , SL[M-1,C-1], and the word line WL corresponds to one of the word lines WL[0]_FL[0], . . . , WL[M-1]_FL[F-1] in, e.g., memory device 200 described with respect to FIG. 2.

In some embodiments, memory cell 300 includes a transistor. For example, the first terminal 302 is a drain of the transistor, the second terminal 204 is a source of the transistor, and the control terminal 306 is a gate of the transistor. In some embodiments, the control terminal 306 includes a gate structure with a floating gate or a charge trapping layer. In some embodiments, memory cell 300 is a floating gate transistor. In some embodiments, memory cell 300 is a Silicon-Oxide-Nitride-Oxide-Silicon (SONOS) cell.

In some embodiments, a threshold voltage of a memory cell 300 depends on a logic state of data stored in the memory cell MC. For example, in some embodiments, for a single-level memory cell (e.g., a memory cell configured to store 1 bit of data), the threshold voltage when the memory cell 300 is in an erased logic state (i.e., the memory cell stores a logic "1") is lower than when memory cell 300 is in a programmed state (i.e., the memory cell stores a logic "0").

For a multi-level memory cell (e.g., a memory cell configured to store more than 1 bit of data), memory cell 300 has more than two threshold voltages corresponding to more than two logic states of the multi-level memory cell. Memory cell 300 is switchable between the logic states and has different threshold voltages corresponding to the logic states.

In some embodiments, in a write or programing operation, a programming bit line voltage, a programming word line voltage and a programming source line voltage are supplied to the corresponding bit line BL, word line WL and source line SL to cause charge carriers (such as electrons) to be injected or tunneled into the gate structure of the control terminal 306, raising the threshold voltage of memory cell 300. As a result, the memory cell 300 has a programed logic state or logic "0."

In some embodiments, in an erase operation, an erasing bit line voltage, an erasing word line voltage and an erasing source line voltage are supplied to the corresponding bit line BL, word line WL and source line SL to cause charge carriers (such as electrons) to be injected or tunneled out of the gate structure of the control terminal 306, reducing the threshold voltage of memory cell 300. As a result, memory cell 300 has an erased logic state or logic "1."

In some embodiments, in a read operation, a read bit line voltage, a read word line voltage and a read source line voltage are supplied to the corresponding bit line BL, word line WL and source line SL, and the current flowing through memory cell 300 is measured by a read circuit (e.g., read circuit 108) to determine the logic state (e.g., "0" or "1") of memory cell 300.

In some embodiments, for a programming operation, the word line WL voltage ranges from about 2 volts (V) to about 4V, the bit line BL voltage ranges from about 0V to about 2V, and the source line SL voltage ranges from about 0V to about 2V. In some embodiments, for a read operation, the word line WL voltage ranges from about 0.7V to about 1.5V, the bit line BL voltage ranges from about 0V to about 1V, and the source line SL voltage ranges from about 0 to about 1V. Other voltage values are within the scope of the present disclosure.

In some embodiments, the programing, erasing and read voltages are supplied to the bit line BL, word line WL and source line SL by the corresponding bit line driver (not shown), word line driver (not shown) and source line driver (not shown) as described with respect to FIG. 1.

Other configurations and types of memory cell 300 are within the scope of the present disclosure.

Figure 4:
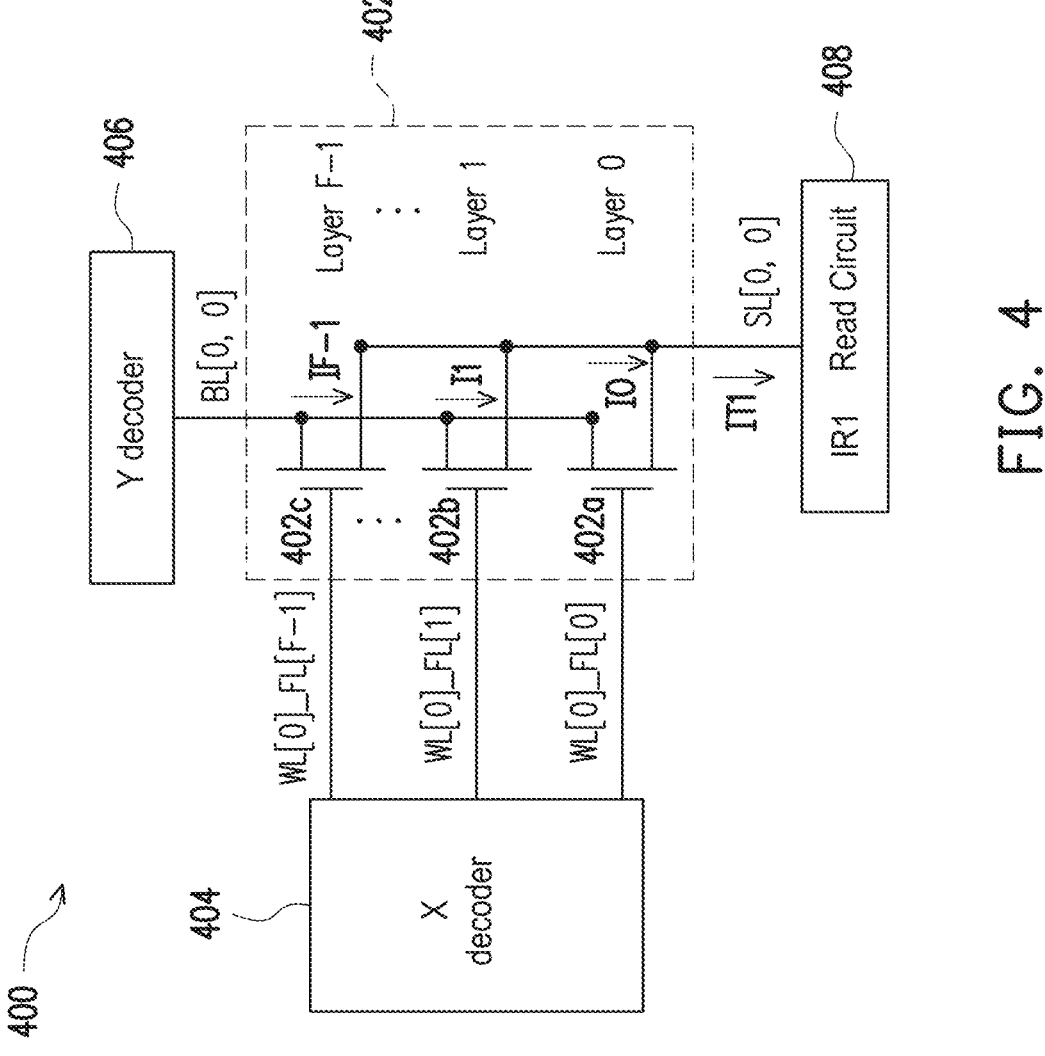
FIG. 4 is a circuit diagram of a memory circuit, in accordance with some embodiments.

FIG. 4 is a circuit diagram of a memory circuit 400, in accordance with some embodiments.

Memory circuit 400 is an embodiment of memory circuit 100 of FIG. 1 expressed in a schematic diagram, and similar detailed description is therefore omitted. For example, memory circuit 400 is an embodiment where memory cell array 402 is a NOR architecture memory cell array.

Memory circuit 400 includes a memory cell array 402, an X-decoder circuit 404, a Y-decoder circuit 406 and a read circuit 408.

Memory cell array 402 is an embodiment of memory cell array 102 of FIG. 1 or memory cell array 202 of FIG. 2, X-decoder circuit 404 is an embodiment of X-decoder circuit 104 of FIG. 1, Y-decoder circuit 406 is an embodiment of Y-decoder circuit 106 of FIG. 1, and read circuit 408 is an embodiment of read circuit 108 of FIG. 1, and similar detailed description is therefore omitted.

FIG. 4 is simplified for ease of illustration. For example, memory cell array 402 shows one pillar of memory cells (e.g., memory cells 402a, 402b, 402c) in the third direction Z for ease of illustration, but memory cell array 402 includes each pillar of memory cells from memory cell array 202 in FIG. 2.

Memory cell array 402 includes memory cells 402a, 402b and 402c. In some embodiments, memory cells 402a, 402b and 402c are corresponding memory cells 202[0,0,0], 202 [0,0,1], . . . , 202[0,0,F-1] of FIG. 2, and similar detailed description is therefore omitted.

Memory cell array 402 is a NOR architecture memory cell array. In other words, memory cells 402a, 402b and 402c are configured in a NOR configuration. For example, in some embodiments, the drains of each of memory cells 402a, 402b and 402c are coupled to bit line BL[0,0], and the sources of each of memory cells 402a, 402b and 402c are coupled to source line SL[0,0].

A gate of memory cells 402a, 402b and 402c is coupled to the X-decoder circuit 404 by a corresponding word line WL[0]_FL[0], WL[0]_FL[1], . . . WL[0]_FL[F-1].

Within each pillar, a drain of each corresponding memory cell on each layer of memory cell array 402 is coupled together by a bit line BL in the pillar, and is further coupled to the Y-decoder circuit 406.

Within each pillar, a source of each corresponding memory cell on each layer of memory cell array 402 is coupled together by a source line SL in the pillar, and is further coupled to the read circuit 408.

A gate of each corresponding memory cell on each layer of memory cell array 402 is coupled to the X-decoder circuit 404 by a corresponding word line WL on each layer.

Each memory cell 402a, 402b, 402c in each layer of memory cell array 402 has a corresponding current I0, I1, . . . , IF-1 that flows through the corresponding memory cell when enabled or turned on. In some embodiments, memory cells 402a, 402b and 402c in memory cell array 402 are enabled during a read operation. Read circuit 408 is configured to receive current I0 from memory cell 402a, current I1 from memory cell 402b, and current IF-1 from memory cell 402c.

During testing of memory cell array 402, a read circuit 408 is configured to measure a total current IT1 from each layer and each pillar of memory cell array 402 to determine failed memory cells in memory cell array 402. In some embodiments, during testing of memory cell array 402, the read circuit 408 is configured to measure the pillar current IPy from each layer of memory cell array 402 in corresponding pillar Y to determine failed memory cells in memory cell array 402 on a pillar by pillar basis. For example, in some embodiments, the pillar current IP0 of pillar 0 is measured during a read operation of memory cell array 402. In some embodiments, the pillar current IPy is measured during a read operation of memory cell array 402. The pillar current IPy corresponds to a sum of the total current I0, I1, . . . , IF-1 from each memory cell on each corresponding layer of memory cell array 402 in pillar Y. Stated differently, the pillar current IPy corresponds to a sum of the total current I0, I1, . . . IF-1 for one pillar (e.g., pillar Y) of memory cells in memory cell array 402. The pillar current IPy of pillar Y is expressed by formula 1.

$$IPy = \sum_{x=0}^{F-1} Ix = I0 + I1 +, \ldots + IF - 1 \qquad (1)$$

where IPy is the pillar current of pillar Y, I0 corresponds to the current of memory cells in layer 0 and pillar Y of memory cell array 402, I1 corresponds to the current of memory cells in layer 1 and pillar Y of memory cell array 402, and IF-1 corresponds to the current of memory cells in layer F-1 and pillar Y of memory cell array 402.

The total current IT1 corresponds to a sum of the total current $IP_0$, $IP_1$, . . . $IP_{P-1}$ from each pillar of memory cells in all layers of memory cell array 402. The total current IT1 for all pillars is expressed by formula 2.

$$IT1 = \sum_{y=0}^{P-1} IPy = IP_0 + IP_1 +, \ldots + IP_{P-1} \qquad (2)$$

where P corresponds to the number of pillars in memory cell array 402, $IP_0$ corresponds to the total current of each memory cell in each layer of memory cell array 402 in pillar 0, $IP_1$ corresponds to the total current of each memory cell in each layer of memory cell array 402 in pillar 1, and $IP_{P-1}$ corresponds to the total current of each memory cell in each layer of memory cell array 402 in pillar P-1.

In some embodiments, during testing of memory cell array 402, the X-decoder circuit 404 and the Y-decoder circuit 406 are configured to simultaneously perform a write operation of each memory cell in each layer of memory cell array 402, and the read circuit 408 is configured to simultaneously perform a read operation of each memory cell in each layer of memory cell array 402 by measuring the total current IT1 for all layers of memory cell array 402.

In some embodiments, if the total current IT1 is equal to an expected read current IR1, then the memory cell array 402 passes the testing process and each memory cell in memory cell array is determined to be fully operational. In some embodiments, if the total current IT1 is not equal to the expected read current IR1, then the memory cell array 402 fails the testing process and one or more failed memory cells are replaced by a corresponding spare memory cell. Further details of one or more embodiments of the testing process are further discussed in method 600 of FIG. 6 and method 700 of FIG. 7.

In some embodiments, during testing of memory cell array 402, the X-decoder circuit 404 and the Y-decoder circuit 406 are configured to simultaneously perform a write operation of each memory cell in each layer of memory cell array 402, and the read circuit 408 is configured to simultaneously perform a read operation of each memory cell in a corresponding layer of memory cell array 402 by measuring the total current IT1 from the corresponding layer of memory cell array 402. In some embodiments, the number of layers that can be simultaneously read is equal to one or more layers. For example, in some embodiments, read circuit 408 is configured to simultaneously perform a read operation of each memory cell in a single layer of memory cell array 402. For example, in some embodiments, read circuit 408 is configured to simultaneously perform a read operation of each memory cell in two layers of memory cell array 402.

In some embodiments, by memory circuit 400 simultaneously performing a write operation of each memory cell in each layer of memory cell array 402, testing time on memory cell array 402 is reduced compared with other approaches thereby improving testing efficiency. In some embodiments, by memory circuit 400 simultaneously performing a read operation of each memory cell in each layer of memory cell array 402, testing time on memory cell array 402 is reduced compared with other approaches thereby improving testing efficiency.

Figure 5:
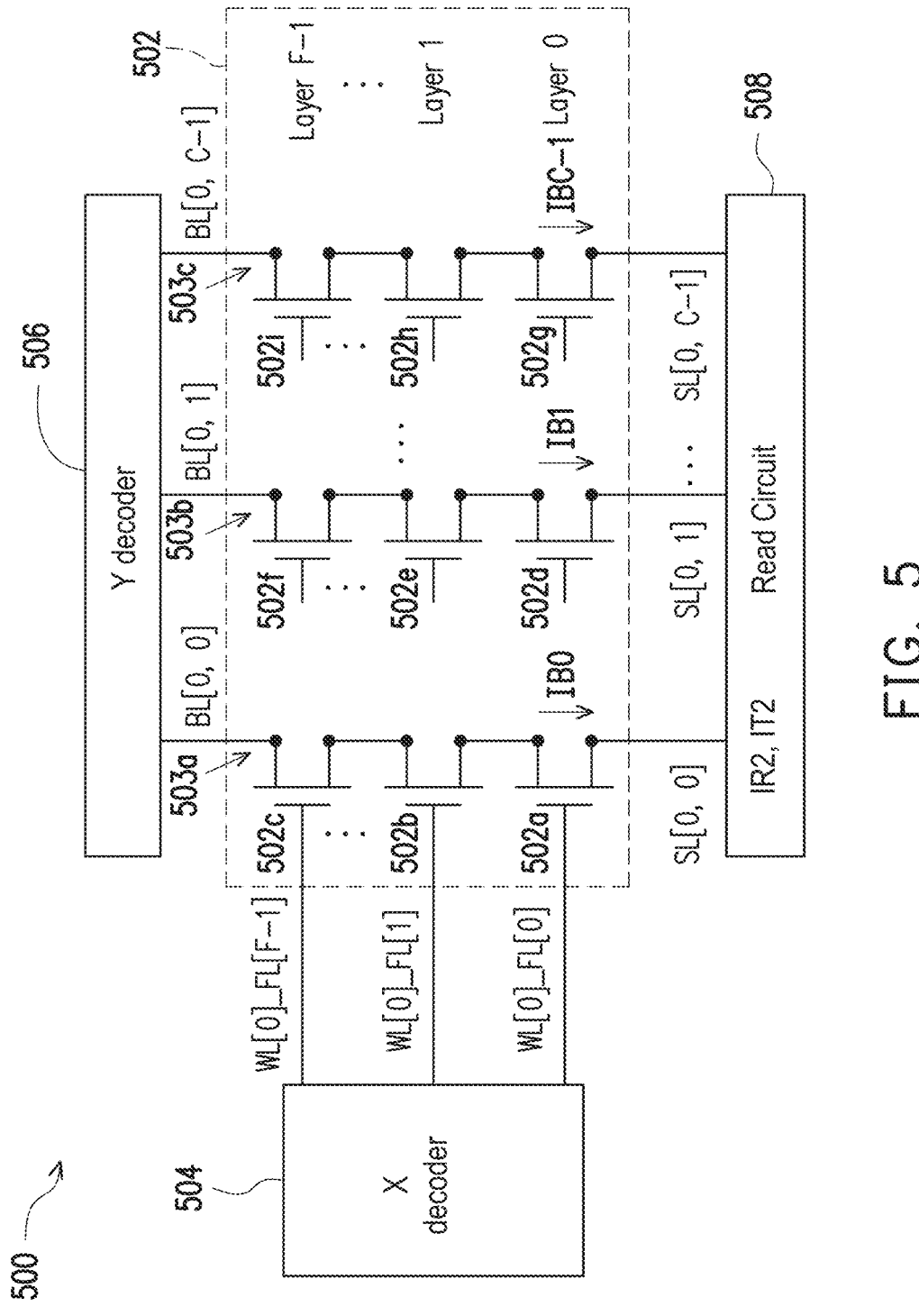
FIG. 5 is a circuit diagram of a memory circuit, in accordance with some embodiments.

FIG. 5 is a circuit diagram of a memory circuit 500, in accordance with some embodiments.

Memory circuit 500 is an embodiment of memory circuit 100 of FIG. 1 expressed in a schematic diagram, and similar detailed description is therefore omitted. For example, memory circuit 500 is an embodiment where memory cell array 502 is a NAND architecture memory cell array.

Memory circuit 500 includes a memory cell array 502, an X-decoder circuit 504, a Y-decoder circuit 506 and a read circuit 508.

Memory cell array 502 is an embodiment of memory cell array 102 of FIG. 1 or memory cell array 202 of FIG. 2, X-decoder circuit 504 is an embodiment of X-decoder circuit 104 of FIG. 1, Y-decoder circuit 506 is an embodiment of Y-decoder circuit 106 of FIG. 1, and read circuit 508 is an embodiment of read circuit 108 of FIG. 1, and similar detailed description is therefore omitted.

FIG. 5 is simplified for ease of illustration. For example, memory cell array 502 shows three pillars (e.g., pillars 503a, 503b and 503c) of memory cells (e.g., memory cells 502a, 502b, 502c, 502d, 502e, 502f, 502g, 502h and 502i) in the third direction Z for ease of illustration, but memory cell array 502 includes each pillar of memory cells from memory cell array 202 in FIG. 2.

Memory cell array 502 includes memory cells 502a, 502b, 502c, 502d, 502e, 502f, 502g, 502h and 502i. In some embodiments, memory cells 502a, 502b and 502c are corresponding memory cells 202[0,0,0], 202[0,0,1], . . . , 202[0,0,F-1] of FIG. 2, memory cells 502d, 502e and 502f are corresponding memory cells 202[0,1,0], 202[0,1,1], . . . , 202[0,C-1,F-1] of FIG. 2, and memory cells 502g, 502h and 502i are corresponding memory cells 202 [0,C-1,0], 202[0,C-1,1], . . . , 202[0,C-1,F-1] of FIG. 2, and similar detailed description is therefore omitted.

Memory cell array 502 is a NAND architecture memory cell array. In other words, memory cells 502a, 502b, 502c, 502d, 502e, 502f, 502g, 502h and 502i are configured in a NAND configuration. For example, in some embodiments, memory cells 502a, 502b and 502c are part of pillar 503a and are serially coupled to bit line BL[0,0] and source line SL[0,0]. Similarly, in some embodiments, memory cells 502d, 502e and 502f are part of pillar 503b and are serially coupled to bit line BL[0,1] and source line SL[0,1], and memory cells 502g, 502h and 502i are part of pillar 503c and are serially coupled to bit line BL[0,C-1] and source line SL[0,C-1].

A gate of memory cells 502a, 502d and 502g is coupled to the X-decoder circuit 504 by word line WL[0]_FL[0]. A gate of memory cells 502b, 502e and 502h is coupled to the X-decoder circuit 504 by word line WL[0]_FL[1]. A gate of memory cells 502c, 502f and 502i is coupled to the X-decoder circuit 504 by word line WL[0]_FL[F-1].

Within each pillar, one or more memory cells on each layer of memory cell array 502 are serially coupled to Y-decoder circuit 506 by a corresponding bit line BL, and are further serially coupled to the X-decoder circuit 504 by a corresponding source line SL.

Each memory cell in each pillar of memory cell array 502 has a corresponding current IB0, IB1, . . . , IBC-1 that flows through the corresponding pillar when enabled or turned on. For example, memory cells 502a, 502b and 502c in pillar 503a have a current IB0 that flows through memory cells 502a, 502b and 502c in pillar 503a when enabled or turned on. Similarly, memory cells 502d, 502e and 502f in pillar 503b have a current IB1 that flows through memory cells 502d, 502e and 502f in pillar 503b when enabled or turned on, and memory cells 502g, 502h and 502i in pillar 503c have a current IBC-1 that flows through memory cells 502g, 502h and 502i in pillar 503c when enabled or turned on. In some embodiments, memory cells 502a, 502b, 502c, 502d, 502e, 502f, 502g, 502h and 502i are enabled during a read operation. Read circuit 508 is configured to receive current IB0 from pillar 503a, current IB1 from pillar 503b, and current IBC-1 from pillar 503c.

During testing of memory cell array 502, a read circuit 508 is configured to measure a total current IT2 from each layer of memory cell array 502 to determine failed memory cells in memory cell array 502. In some embodiments, the total current IT2 is measured during a read operation of memory cell array 502. The total current IT2 corresponds to a sum of the total current IB0, IB1, . . . IBC-1 from each memory cell on each corresponding layer of memory cell array 502. Stated differently, the total current IT2 corresponds to a sum of the total current IB0, IB1, . . . IBC-1 from each corresponding pillar of memory cells in memory cell array 502. The total current IT2 is expressed by formula 3.

$$IT2 = \sum\nolimits_{x=0}^{C-1} IBx = IB0 + IB1 +, \ldots + IBC - 1 \qquad (3)$$

where IB0 corresponds to the total current of each memory cell in layers 0 through F-1 in pillar 503a of memory cell array 502, IB1 corresponds to the total current of each memory cell in layers 0 through F-1 in pillar 503b of memory cell array 502, and IBC-1 corresponds to the total current of each memory cell in layers 0 through F-1 in pillar 503c of memory cell array 502.

In some embodiments, during testing of memory cell array 502, the X-decoder circuit 504 and the Y-decoder circuit 506 are configured to simultaneously perform a write operation of each memory cell in each layer of memory cell array 502, and the read circuit 508 is configured to simultaneously perform a read operation of each memory cell in each layer of memory cell array 502 by measuring the total current IT2 from each pillar and each layer of memory cell array 502.

In some embodiments, if the total current IT2 is equal to an expected read current IR2, then the memory cell array 502 passes the testing process and each memory cell in memory cell array is determined to be fully operational. In some embodiments, if the total current IT2 is not equal to the expected read current IR2, then the memory cell array 502 fails the testing process and one or more failed memory cells are replaced by a corresponding spare memory cell. Further details of one or more embodiments of the testing process are further discussed in method 600 of FIG. 6 and method 700 of FIG. 7.

In some embodiments, during testing of memory cell array 502, the X-decoder circuit 504 and the Y-decoder circuit 506 are configured to simultaneously perform a write operation of each memory cell in each layer of memory cell array 502, and the read circuit 508 is configured to simultaneously perform a read operation of each memory cell in a corresponding pillar of memory cell array 502 (on a pillar by pillar basis) by measuring the total current IBx from the corresponding pillar X of memory cell array 502. In some embodiments, the number of pillars that can be simultaneously read is equal to one or more pillars. For example, in some embodiments, read circuit 508 is configured to simultaneously perform a read operation of each memory cell in a single pillar of memory cell array 502. For example, in some embodiments, read circuit 508 is configured to simultaneously perform a read operation of each memory cell in two pillars of memory cell array 502.

In some embodiments, by memory circuit 500 simultaneously performing a write operation of each memory cell in each layer of memory cell array 502, testing time on memory cell array 502 is reduced compared with other approaches thereby improving testing efficiency. In some embodiments, by memory circuit 500 simultaneously performing a read operation of each memory cell in each layer of memory cell array 502, testing time on memory cell array 502 is reduced compared with other approaches thereby improving testing efficiency.

Figure 6:
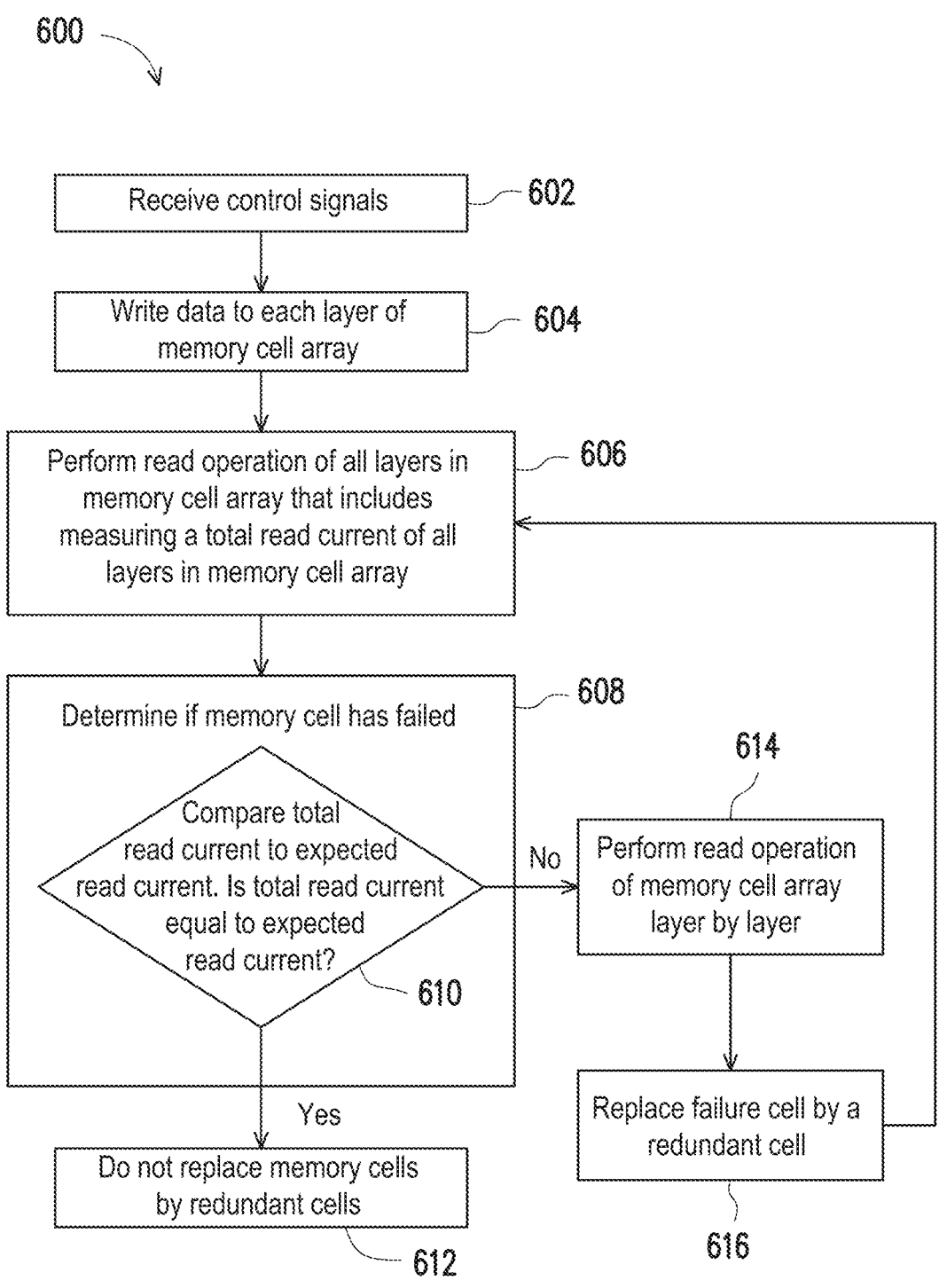
FIG. 6 is a flowchart of a method of testing a circuit, in accordance with some embodiments.

FIG. 6 is a flowchart of a method 600 of testing a circuit, in accordance with some embodiments.

In some embodiments, FIG. 6 is a flowchart of a method of testing memory circuit 100, 400 or 500 of corresponding FIG. 1, 4 or 5. In some embodiments, FIG. 6 is a flowchart of a method of testing memory cell array 102, 202, 402 or 502 of corresponding FIG. 1, 2, 4 or 5. It is understood that additional operations may be performed before, during, and/or after the method 600 depicted in FIG. 6, and that some other operations may only be briefly described herein. In some embodiments, other order of operations of method 600 is within the scope of the present disclosure. Method 600 includes exemplary operations, but the operations are not necessarily performed in the order shown. Operations may be added, replaced, changed order, and/or eliminated as appropriate, in accordance with the spirit and scope of disclosed embodiments. It is understood that method 600 utilizes features of one or more of memory circuit 100, 200, 400 and 500, and memory cell 300.

In operation 602 of method 600, a first set of control signals and a second set of control signals is received. In some embodiments, the first set of control signals of method 600 or 700 includes set of control signals CS1 and the second set of control signals includes set of control signals CS2. In some embodiments, the first set of control signals is received by at least X-decoder circuit 104, 404 or 504. In some embodiments, the second set of control signals is received by at least Y-decoder circuit 106, 406 or 506.

In some embodiments, operation 602 further includes generating the first set of control signals and the second set of control signals. In some embodiments, the first set of control signals and the second set of control signals are generated by at least read circuit 108, 408 or 508.

In operation 604 of method 600, data is simultaneously written to each layer of memory cells in a 3D memory cell array. In some embodiments, the 3D memory cell array of method 600 or 700 includes at least memory cell array 102, 202, 402 or 502. In some embodiments, the same data (e.g., logic "0" or "1") is written to each memory cell. In some embodiments, operation 604 includes data being simultaneously written to at least two layers of memory cells in the 3D memory cell array.

In some embodiments, operation 604 is performed by at least X-decoder circuit 104, 404 or 504, or Y-decoder circuit 106, 406 or 506.

In some embodiments, operation 604 includes simultaneously applying a first word line voltage to each word line of each memory cell in all layers in the 3D memory cell array, simultaneously applying a first bit line voltage to each bit line of each memory cell in all layers in the 3D memory cell array, and simultaneously applying a first source line voltage to each source line of each memory cell in all layers in the 3D memory cell array.

In some embodiments, each memory cell in all layers in the 3D memory cell array of method 600 includes each memory cell in memory cell array 102, 202, 402 or 502. In some embodiments, the first word line voltage of method 600 or 700 includes a voltage of word lines WL. In some embodiments, the first bit line voltage of method 600 or 700 includes a voltage of bit lines BL. In some embodiments, the first source line voltage of method 600 or 700 includes a voltage of source lines SL.

In operation 606 of method 600, a read operation is simultaneously performed on each memory cell in all layers in the 3D memory cell array.

In some embodiments, operation 606 is performed by at least read circuit 108, 408 or 508. In some embodiments, operation 606 is performed by system 800.

In some embodiments, operation 606 further includes measuring a total read current of each memory cell in all layers in the 3D memory cell array. In some embodiments, the total read current of method 600 includes at least total current IT1 or total current IT2.

In operation 608 of method 600, a determination is made whether a memory cell in the 3D memory cell array has failed in response to the read operation. In some embodiments, operation 608 includes operation 610. In some embodiments, a memory cell in the 3D memory cell array of method 600 includes one or more memory cells in memory cell array 102, 202, 402 or 502.

In some embodiments, operation 608 is performed by at least read circuit 108, 408 or 508. In some embodiments, operation 608 is performed by system 800.

In operation 610 of method 600, the total read current of each memory cell in all layers in the 3D memory cell array is compared with an expected total read current. In some embodiments, the expected total read current of method 600 includes at least expected read current IR1 or expected read current IR2. In some embodiments, operation 610 is performed by at least read circuit 108, 408 or 508. In some embodiments, operation 610 is performed by system 800.

In some embodiments, operations 606 and 608 are performed individually for each pillar. For example, in some embodiments, operation 606 further includes measuring a read current (e.g., pillar current IPy or total current IB0 for pillar 503a) of each memory cell in a single pillar (e.g., pillar Y or pillar 503a) in the 3D memory cell array, and operation 608 further includes determining whether a memory cell in the single pillar (e.g., pillar Y or pillar 503a) has failed by comparing the read current (e.g., pillar current IPy or total current IB0 for pillar 503a) in pillar Y (or pillar 503a) with the expected read current from pillar Y (or pillar 503a). In these embodiments, operations 606, 608, 610, 614 and 616 are performed individually for each pillar, and then are repeated for each pillar.

In some embodiments, operation 610 further includes determining if the total read current of each memory cell in all layers in the 3D memory cell array is equal to the expected total read current. In some embodiments, method 600 determines that the total read current of each memory cell in all layers in the 3D memory cell array is equal to the expected total read current, if the total read current of each memory cell in all layers in the 3D memory cell array is different from the expected total read current by about 5%. In some embodiments, two items that are compared to each other are determined to be equal to each other, if they differ from each other by 5% or less. In some embodiments, two items that are compared to each other are determined to not be equal to each other, if they differ from each other by more than 5%. Other tolerance values are within the scope of the present disclosure.

In some embodiments, operation 610 further includes system 800 being configured to convert analog current values into digital current values. In some embodiments, the digital current values are compared with expected total read current values, such as expected read current IR1 and IR2. In some embodiments, the expected total read current values (e.g., expected read current IR1 and IR2) are stored in system in memory 804 as current values 816. In some embodiments, the expected read total current values are known in advance based on design parameters.

In some embodiments, determining whether a memory cell in the 3D memory cell array has failed in response to the read operation of operation 608 includes determining if the total read current of each memory cell in all layers in the 3D memory cell array is equal to the expected total read current of operation 610.

In some embodiments, if the total read current of each memory cell in all layers in the 3D memory cell array is equal to the expected total read current, then no memory cell has failed, and the result of operation 608 is a "no" or the result of operation 610 is a "yes", and method 600 proceeds to operation 612.

In some embodiments, if the total read current of each memory cell in all layers in the 3D memory cell array is not equal to the expected total read current, then at least one memory cell has failed, and the result of operation 608 is a "yes" or the result of operation 610 is a "no", and method 600 proceeds to operation 614.

In operation 612 of method 600, memory cells in the 3D memory cell array are not replaced by a spare memory cell. In some embodiments, memory cells in the 3D memory cell array are not replaced by a spare memory cell in response to determining that memory cells in the 3D memory cell array have not failed.

In some embodiments, operation 612 includes method 600 remaining in an idle state. In some embodiments, the idle state corresponds to method 600 waiting for an update from one of the parameters of operations 602-616. In some embodiments, method 600 remains in the idle state until additional read or write operations or an erase operation are performed. In some embodiments, if additional read or write operations or an erase operation are performed, then operation 612 may return (not shown in FIG. 6) to operation 602 or 604. In some embodiments, the idle state of operation 612 may include the end of method 600.

In operation 614 of method 600, a read operation of each memory cell in each layer of the 3D memory cell array is performed layer by layer. In some embodiments, the read operation of operation 614 is performed to identify one or more failed layers that include failed memory cells, and then further read operations are performed within each failed layer to identify failed memory cells within the failed layer.

In some embodiments, identifying failed memory cells within the failed layer includes performing read operations of each individual memory cell based on an expected read current value of the individual memory cell. In some embodiments, if the read current of the individual memory cell is not equal to an expected read current of the individual memory cell, then the individual memory cell is a failed memory cell. In some embodiments, the read operations of each individual memory cell includes setting voltages of the corresponding bit line, word line and source line coupled to the individual memory cell.

In some embodiments, the read operation of each memory cell in each layer of the 3D memory cell array of operation 614 performed layer by layer includes performing a read operation of each memory cell in a first layer of the 3D memory cell array, performing a read operation of each memory cell in a second layer of the 3D memory cell array, and the read operation is then subsequently repeated for each remaining layer in the 3D memory cell array. In some embodiments, the first layer of method 600 or 700 includes layer 0 of memory cell array 202, the second layer of method 600 or 700 includes layer 1 of memory cell array 202, and the remaining layers of method 600 or 700 includes layers 2 through F-1 of memory cell array 202.

In some embodiments, performing the read operation of each memory cell in the first layer of the 3D memory cell array includes measuring a first read current of each memory cell in the first layer of the 3D memory cell array.

In some embodiments, performing the read operation of each memory cell in the first layer of the 3D memory cell array further includes determining that a first memory cell in the first layer of the 3D memory cell array failed in response to the first read current of each memory cell in the first layer of the 3D memory cell array not being equal to a first expected read current. In some embodiments, the first expected read current is equal to the expected read current IR1 divided by the number of layers F (e.g., IR1/F). In some embodiments, the first read current of method 600 or 700 includes current I0.

In some embodiments, performing the read operation of each memory cell in the first layer of the 3D memory cell array further includes determining that no memory cells in the first layer of the 3D memory cell array failed in response to the first read current of each memory cell in the first layer of the 3D memory cell array being equal to the first expected read current.

In some embodiments, performing the read operation of each memory cell in the first layer of the 3D memory cell array further includes enabling each row of memory cells in the first layer of the 3D memory cell array in response to a second word line voltage on each word line in the first layer of the 3D memory cell array, and enabling each column of memory cells in the first layer of the 3D memory cell array in response to a second bit line voltage on each bit line in the first layer of the 3D memory cell array and a second source line voltage on each source line in the first layer of the 3D memory cell array.

In some embodiments, the second word line voltage of method 600 or 700 includes a voltage of word lines WL. In some embodiments, the second bit line voltage of method 600 or 700 includes a voltage of bit lines BL. In some embodiments, the second source line voltage of method 600 or 700 includes a voltage of source lines SL. In some embodiments, the second word line voltage is equal to the first word line voltage. In some embodiments, the second bit line voltage is equal to the first bit line voltage. In some embodiments, the second source line voltage is equal to the first source line voltage.

In some embodiments, performing the read operation of each memory cell in the first layer of the 3D memory cell array further includes disabling each row of memory cells in other layers of the 3D memory cell array in response to a third word line voltage on each word line in the other layers of the 3D memory cell array, and disabling each column of memory cells in the other layers of the 3D memory cell array in response to a third bit line voltage on each bit line in the other layers of the 3D memory cell array and a third source line voltage on each source line in the other layers of the 3D memory cell array.

In some embodiments, each row of memory cells in other layers of the 3D memory cell array includes row of memory cells not in layer 0 of the 3D memory cell array. In some embodiments, each column of memory cells in other layers of the 3D memory cell array includes column of memory cells not in layer 0 of the 3D memory cell array.

In some embodiments, the third word line voltage of method 600 or 700 includes a voltage of word lines WL. In some embodiments, the third bit line voltage of method 600 or 700 includes a voltage of bit lines BL. In some embodiments, the third source line voltage of method 600 or 700 includes a voltage of source lines SL. In some embodiments, the third word line voltage is not equal to the first word line voltage or the second word line voltage. In some embodiments, the third bit line voltage is not equal to the first bit line voltage or the second bit line voltage. In some embodiments, the third source line voltage is not equal to the first source line voltage or the second source line voltage.

The operations of 614 are repeated for each of the remaining layers of the 3D memory cell array. For example, in some embodiments, performing the read operation of each memory cell in the second layer of the 3D memory cell array is similar to performing the read operation of each memory cell in the first layer of the 3D memory cell array, and is not repeated for brevity. In some embodiments, performing the read operation of each memory cell in the remaining layers of the 3D memory cell array is similar to performing the read operation of each memory cell in the first layer of the 3D memory cell array, and is not repeated for brevity.

In operation 616 of method 600, at least one failed memory cell in the 3D memory cell array is replaced with a spare memory cell in response to determining that at least one memory cell in the 3D memory cell array has failed. In some embodiments, a spare memory cell of method 600 or 700 includes a spare memory cell in spare memory cell array 102b of FIG. 1. In some embodiments, by replacing a memory cell with a spare memory cell, the replaced memory cell is configured to not store data, and the spare memory cell is configured to store data.

After operation 616, method 600 returns to operation 606 to perform additional read operations. In some embodiments, the additional read operations are performed in operation 606 to determine if the revised memory cell array still includes failed memory cells or new failed memory cells. In some embodiments, the additional read operations include simultaneously performing another read operation of each memory cell in all layers in the 3D memory cell array after replacing at least one failed memory cell in the 3D memory cell array with the spare memory cell.

By performing method 600, the testing of the memory circuit operates to achieve the benefits discussed above with respect to memory circuits 100, 400 and 500. While method 600 was described above with reference to FIGS. 1, 2, 3, 4, and 8, it is understood that method 600 utilizes the features of one or more of FIGS. 5 and 8.

Figure 7:
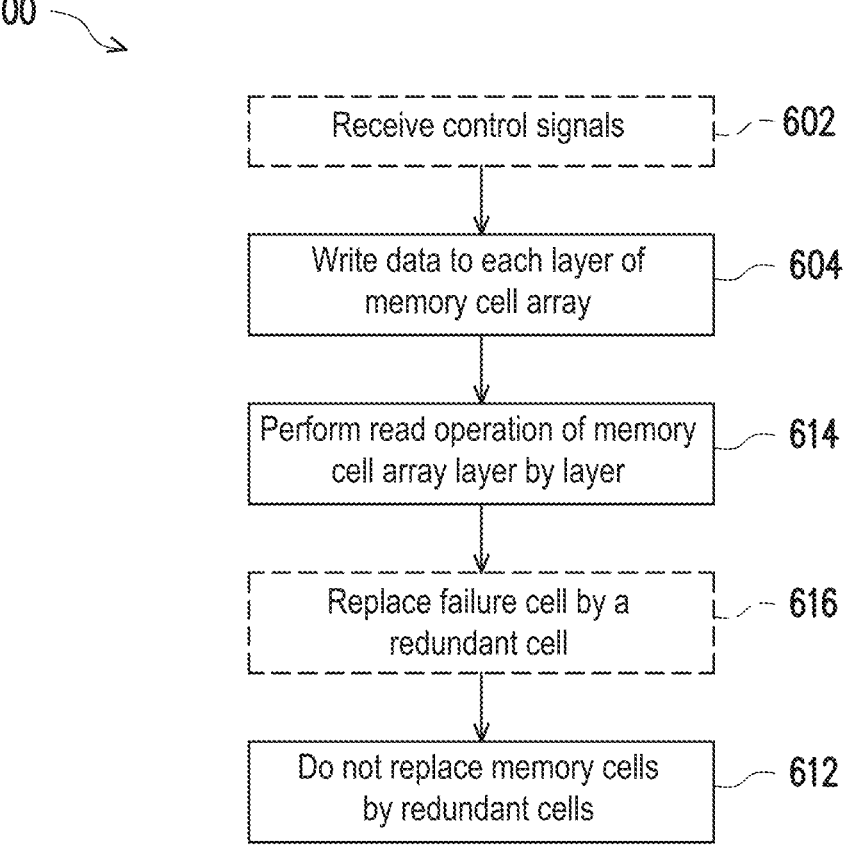
FIG. 7 is a flowchart of a method of testing a circuit, in accordance with some embodiments.

FIG. 7 is a flowchart of a method 700 of testing a circuit, in accordance with some embodiments.

In some embodiments, FIG. 7 is a flowchart of a method of testing memory circuit 100, 400 or 500 of corresponding FIG. 1, 4 or 5. In some embodiments, FIG. 7 is a flowchart of a method of testing memory cell array 102, 202, 402 or 502 of corresponding FIG. 1, 2, 4 or 5. It is understood that additional operations may be performed before, during, and/or after the method 700 depicted in FIG. 7, and that some other operations may only be briefly described herein. In some embodiments, other order of operations of method 700 is within the scope of the present disclosure. Method 700 includes exemplary operations, but the operations are not necessarily performed in the order shown. Operations may be added, replaced, changed order, and/or eliminated as appropriate, in accordance with the spirit and scope of disclosed embodiments. It is understood that method 700 utilizes features of one or more of memory circuit 100, 200, 400 and 500, and memory cell 300.

Method 700 is a variation of method 600. In comparison with method 600 of FIG. 6, method 700 does not include operations 606, 608, and 610, and similar detailed description is therefore omitted.

In comparison with method 600 of FIG. 6, method 700 includes operations 602, 604, 614, 616 and 612, and similar detailed description is therefore omitted. The details of similar aspects of operations 602, 604, 614, 616 and 612 of method 700 in comparison with method 600 are omitted for brevity.

In operation 602 of method 700, a first set of control signals and a second set of control signals is received. The details of operation 602 of method 700 are similarly described in operation 602 of method 600, and similar detailed description is therefore omitted for brevity.

In operation 604 of method 700, data is simultaneously written to each layer of memory cells in a 3D memory cell array. The details of operation 604 of method 700 are similarly described in operation 604 of method 600, and similar detailed description is therefore omitted for brevity.

In operation 614 of method 700, a read operation of each memory cell in each layer of the 3D memory cell array is performed layer by layer. The details of operation 614 of method 700 are similarly described in operation 614 of method 600, and similar detailed description is therefore omitted for brevity.

In operation 616 of method 700, at least one failed memory cell in the 3D memory cell array is replaced with a spare memory cell in response to determining that at least one memory cell in the 3D memory cell array has failed. The details of operation 616 of method 700 are similarly described in operation 616 of method 600, and similar detailed description is therefore omitted for brevity.

In operation 612 of method 700, memory cells in the memory cell in the 3D memory cell array are not replaced by a spare memory cell. In some embodiments, operation 612 includes method 700 remaining in an idle state. The details of operation 612 of method 700 are similarly described in operation 612 of method 600, and similar detailed description is therefore omitted for brevity.

By operating method 700, the testing of the memory circuit operates to achieve the benefits discussed above with respect to memory circuits 100, 400 and 500. While method 700 was described above with reference to FIGS. 1, 2, 3, 4, and 8, it is understood that method 700 utilizes the features of one or more of FIG. 5.

Figure 8:
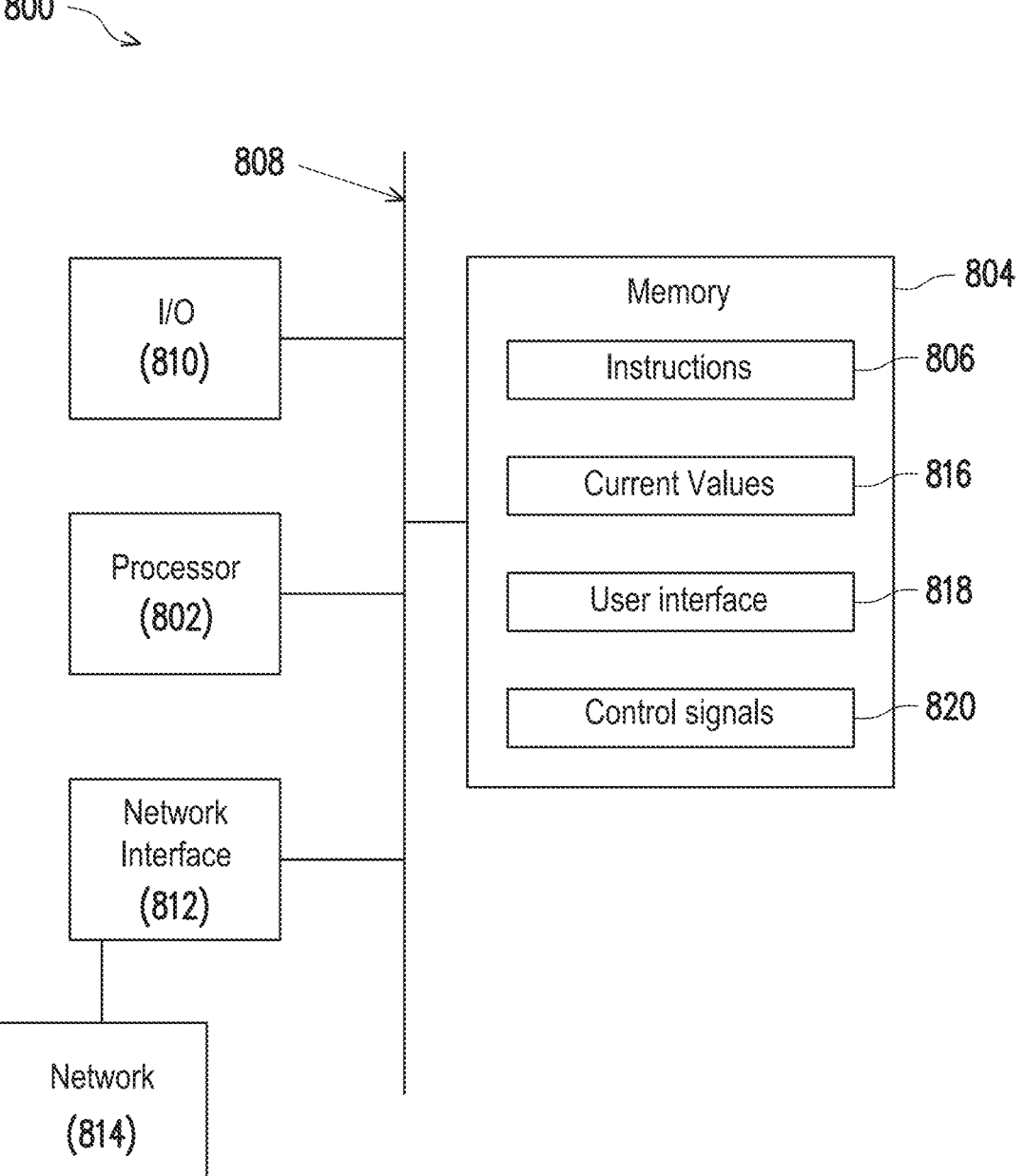
FIG. 8 is a schematic view of a system, in accordance with some embodiments.

FIG. 8 is a schematic view of a system 800, in accordance with some embodiments. In some embodiments, system 800 is an embodiment of at least read circuit 108 of FIG. 1, read circuit 408 of FIG. 4 or read circuit 508 of FIG. 5, and similar detailed description is therefore omitted.

In some embodiments, system 800 is configured to control one or more of memory cell array 102, 202, 402 or 502, X-decoder circuit 104, 404 or 504 or Y-decoder circuit 106, 406 or 506. In some embodiments, system 800 is configured to measure the read current (e.g., total current IT1 or total current IT2) from at least memory cell array 102, 202, 402 or 502. In some embodiments, system 800 is configured to compare the read current (e.g., total current IT1 or total current IT2) from at least memory cell array 102, 202, 402 or 502 with at least expected read current IR1 or IR2.

System 800 includes a hardware processor 802 and a non-transitory, computer readable storage medium 804 (e.g., memory 804) encoded with, i.e., storing, the computer program code 806, i.e., a set of executable instructions 806. Computer readable storage medium 804 is configured for interfacing with at least memory circuit 100, 400 or 500 for testing at least memory cell array 102, 202 402 or 502. The processor 802 is electrically coupled to the computer readable storage medium 804 by a bus 808. The processor 802 is also electrically coupled to an I/O interface 810 by bus 808. A network interface 812 is also electrically connected to the processor 802 by bus 808. Network interface 812 is connected to a network 814, so that processor 802 and computer readable storage medium 804 are capable of connecting to external elements by network 814. The processor 802 is configured to execute the computer program code 806 encoded in the computer readable storage medium 804 in order to cause system 800 to be usable for performing a portion or all of the operations as described in at least method 600 or 700.

In some embodiments, the processor 802 is a central processing unit (CPU), a multi-processor, a distributed processing read circuit, an application specific integrated circuit (ASIC), and/or a suitable processing unit.

In some embodiments, the computer readable storage medium 804 is an electronic, magnetic, optical, electromagnetic, infrared, and/or a semiconductor read circuit (or apparatus or device). For example, the computer readable storage medium 804 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 804 includes a compact disk-read only memory (CD-ROM), a compact disk-read/write (CD-R/W), and/or a digital video disc (DVD).

In some embodiments, the storage medium 804 stores the computer program code 806 configured to cause system 800 to perform one or more operations of at least method 600 or 700. In some embodiments, the storage medium 804 also stores information used for performing at least method 600 or 700 as well as information generated during performing at least method 600 or 700, such as current values 816, user interface 818 and control signals 820, and/or a set of executable instructions to perform one or more operations of at least method 600 or 700.

In some embodiments, the storage medium 804 stores instructions (e.g., computer program code 806) for interfacing with at least memory circuit 100, 400 or 500. The instructions (e.g., computer program code 806) enable processor 802 to generate testing instructions readable by at least read circuit 108, 408 or 508 or memory circuit 100, 400 or 500 to effectively implement one or more operations of at least method 600 or 700 during a testing process.

System 800 includes I/O interface 810. I/O interface 810 is coupled to external circuitry. In some embodiments, I/O interface 810 includes a keyboard, keypad, mouse, trackball, trackpad, and/or cursor direction keys for communicating information and commands to processor 802

System 800 also includes network interface 812 coupled to the processor 802. Network interface 812 allows system 800 to communicate with network 814, to which one or more other computer read circuits are connected. Network interface 812 includes wireless network interfaces such as BLUETOOTH, WIFI, WIMAX, GPRS, or WCDMA; or wired network interface such as ETHERNET, USB, or IEEE-994. In some embodiments, at least method 600 or 700 is implemented in two or more read circuits 800, and information such as current values, user interface and control signals are exchanged between different read circuits 800 by network 814

System 800 is configured to receive information related to current values through I/O interface 810 or network interface 812. The information is transferred to processor 802 by bus 808 to determine, measure or compare current values during a read operation of memory cell array 102, 202, 402 or 502. The current values are then stored in computer readable medium 804 as current values 816. In some embodiments, current values 816 include one or more of total current IT1, total current IT2, current I0, I1, . . . , IF-1, current IB0, IB1, . . . IBC-1, expected current IR1 or IR2. System 800 is configured to receive information related to a user interface through I/O interface 810 or network interface 812. The information is stored in computer readable medium 804 as user interface 818. System 800 is configured to receive information related to control signals through I/O interface 810 or network interface 812. The information is stored in computer readable medium 804 as control signals 820. In some embodiments, control signals include at least set of control signals CS1 or CS2.

In some embodiments, at least method 600 or 700 is implemented as a standalone software application for execution by a processor. In some embodiments, at least method 600 or 700 is implemented as a software application that is a part of an additional software application. In some embodiments, at least method 600 or 700 is implemented as a plug-in to a software application. In some embodiments, at least method 600 or 700 is implemented as a software application that is a portion of a testing tool. In some embodiments, at least method 600 or 700 is implemented as a software application that is used by a testing tool. In some embodiments, the testing tool is used to test at least memory circuit 100, 400 or 500.

In some embodiments, at least method 600 or 700 is implemented by a memory circuit such as memory circuit 100, 400 or 500 to test at least memory cell array 102, 202, 402 or 502 using a set of control signals CS1 or CS2 or expected read current IR1 or IR2 based on one or more instructions generated by system 800.

In some embodiments, system 800 is configured to convert analog current values into digital current values. In some embodiments, the digital current values are compared with expected read current values such as expected read current IR1 and IR2.

In some embodiments, one or more of the operations of method 600 or 700 is not performed. Furthermore, various N-type transistors shown in FIGS. 3-5 are of a particular dopant type (e.g., N-type or P-type) are for illustration purposes. Embodiments of the disclosure are not limited to a particular transistor type, and one or more of the N-type transistors shown in FIGS. 3-5 can be substituted with a corresponding transistor of a different transistor/dopant type. Similarly, the low or high logical value of various signals used in the above description is also for illustration. Embodiments of the disclosure are not limited to a particular logical value when a signal is activated and/or deactivated. Selecting different logical values is within the scope of various embodiments. Selecting different numbers of transistors in FIG. 3-5 is within the scope of various embodiments.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

One aspect of this description relates to a method of testing a three dimensional (3D) memory cell array. In some embodiments, the method includes applying a first voltage to word lines of each layer of memory cells in the 3D memory cell array thereby performing a write operation of the 3D memory cell array. In some embodiments, the method further includes simultaneously performing a first read operation of each memory cell in at least a first pillar of the 3D memory cell array, the first pillar including memory cells on each corresponding layer of the 3D memory cell array. In some embodiments, the method further includes determining that a memory cell in the first pillar of the 3D memory cell array has failed in response to the first read operation. In some embodiments, the method further includes simultaneously performing a second read operation of each memory cell in a first layer of the first pillar of the 3D memory cell array. In some embodiments, the simultaneously performing the second read operation of each memory cell in the first layer of the first pillar of the 3D memory cell array includes comparing a total read current of each memory cell in the first layer of the first pillar of the 3D memory cell array with a corresponding expected total read current of each corresponding memory cell in the first layer of the first pillar of the 3D memory cell. In some embodiments, the simultaneously performing the second read operation of each memory cell in the first layer of the first pillar of the 3D memory cell array includes replacing at least one failed memory cell in the first layer of the first pillar of the 3D memory cell array with a spare memory cell.

Another aspect of this description relates to a method of testing a three dimensional (3D) memory cell array. In some embodiments, the method includes applying a first voltage to word lines of each layer of memory cells in the 3D memory cell array thereby performing a write operation of the 3D memory cell array. In some embodiments, the method further includes simultaneously performing a read operation of each memory cell in a first layer of the 3D memory cell array. In some embodiments, the simultaneously performing the read operation of each memory cell in the first layer of the 3D memory cell array includes comparing a first total read current of each memory cell in the first layer of the 3D memory cell array with a first expected read current of each memory cell in the first layer of the 3D memory cell. In some embodiments, the simultaneously performing the read operation of each memory cell in the first layer of the 3D memory cell array further includes determining that each memory cell in the first layer of the 3D memory cell array has not failed in response to the read operation of the first layer of the 3D memory cell array. In some embodiments, the simultaneously performing the read operation of each memory cell in the first layer of the 3D memory cell array further includes not replacing at least one failed memory cell in the first layer of the 3D memory cell array with a first spare memory cell, in response to determining that each memory cell in the first layer of the 3D memory cell array has not failed.

Still another aspect of this description relates to a memory circuit. In some embodiments, the memory circuit includes a first memory cell array on a first layer and a second memory cell array on a second layer different from the first layer. In some embodiments, the memory circuit further includes a decoder circuit coupled to the first memory cell array and the second memory cell array by a set of word lines, a set of bit lines or a set of source lines, the decoder circuit configured to simultaneously perform a write operation of each memory cell in the first layer of the first memory cell array. In some embodiments, the memory circuit further includes a read circuit coupled to at least the first memory cell array or the second memory cell array, the read circuit being configured to simultaneously perform a read operation of each memory cell in the first layer of the first memory cell array, and configured to determine whether a memory cell in the first layer of the first memory cell array has failed in response to the read operation. In some embodiments, the read circuit configured to simultaneously perform the read operation of each memory cell in the first layer of the first memory cell array comprises the read circuit being further configured to compare a total read current of each memory cell in the first layer of the first memory cell array with an expected total read current of each memory cell in the first layer of the first memory cell array.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of testing a three dimensional (3D) memory cell array, the method comprising:

applying a first voltage to word lines of each layer of memory cells in the 3D memory cell array thereby performing a write operation of the 3D memory cell array;

simultaneously performing a first read operation of each memory cell in at least a first pillar of the 3D memory cell array, the first pillar including memory cells on each corresponding layer of the 3D memory cell array;

determining that a memory cell in the first pillar of the 3D memory cell array has failed in response to the first read operation; and simultaneously performing a second read operation of each memory cell in a first layer of the first pillar of the 3D memory cell array, wherein the simultaneously performing the second read operation of each memory cell in the first layer of the first pillar of the 3D memory cell array comprises:

comparing a total read current of each memory cell in the first layer of the first pillar of the 3D memory cell array with a corresponding expected total read current of each corresponding memory cell in the first layer of the first pillar of the 3D memory cell; and replacing at least one failed memory cell in the first layer of the first pillar of the 3D memory cell array with a spare memory cell.

2. The method of claim 1, further comprising:

simultaneously applying a first bit line voltage to bit lines of each layer of memory cells in the 3D memory cell array thereby performing the write operation of the 3D memory cell array; and simultaneously applying a first source line voltage to source lines of each layer of memory cells in the 3D memory cell array thereby performing the write operation of the 3D memory cell array.

3. The method of claim 1, wherein the simultaneously performing the first read operation of each memory cell in at least the first pillar of the 3D memory cell array comprises:

simultaneously applying a first word line voltage to each word line of each memory cell in the first pillar of the 3D memory cell array;

simultaneously applying a first bit line voltage to a first bit line of the first pillar of the 3D memory cell array; and simultaneously applying a first source line voltage to a first source line of the first pillar of the 3D memory cell array.

4. The method of claim 1, wherein the simultaneously performing the second read operation of each memory cell in the first layer of the first pillar of the 3D memory cell array comprises:

simultaneously applying a first word line voltage to each word line of each memory cell in the first layer of the first pillar of the 3D memory cell array;

simultaneously applying a first bit line voltage to a first bit line of the first layer of the first pillar of the 3D memory cell array; and simultaneously applying a first source line voltage to a first source line of the first layer of the first pillar of the 3D memory cell array.

5. The method of claim 1, wherein the simultaneously performing the second read operation of each memory cell in the first layer of the first pillar of the 3D memory cell array further comprises:

determining that the total read current of each memory cell in the first layer of the first pillar of the 3D memory cell array is not equal to the corresponding expected total read current of each corresponding memory cell in the first layer of the first pillar of the 3D memory cell.

6. The method of claim 5, further comprising:

determining that a first memory cell in the first layer of the first pillar of the 3D memory cell array failed in response to the total read current of each memory cell in the first layer of the first pillar of the 3D memory cell array not being equal to the corresponding expected total read current of each corresponding memory cell in the first layer of the first pillar of the 3D memory cell.

7. The method of claim 6, wherein the simultaneously performing the second read operation of each memory cell in the first layer of the first pillar of the 3D memory cell array further comprises:

enabling each row of memory cells in the first layer of the first pillar of the 3D memory cell array in response to a first word line voltage on each word line in the first layer of the first pillar of the 3D memory cell array; and enabling each column of memory cells in the first layer of the first pillar of the 3D memory cell array in response to a first bit line voltage on each bit line in the first layer of the first pillar of the 3D memory cell array and a first source line voltage on each source line in the first layer of the first pillar of the 3D memory cell array.

8. The method of claim 7, wherein the simultaneously performing the second read operation of each memory cell in the first layer of the first pillar of the 3D memory cell array further comprises:

disabling each row of memory cells in other layers of the first pillar of the 3D memory cell array in response to a second word line voltage on each word line in the other layers of the first pillar of the 3D memory cell array, the other layers of the 3D memory cell array not including the first layer; and disabling each column of memory cells in the other layers of the first pillar of the 3D memory cell array in response to a second bit line voltage on each bit line in the other layers of the first pillar of the 3D memory cell array and a second source line voltage on each source line in the other layers of the first pillar of the 3D memory cell array.

9. The method of claim 6, further comprising:

simultaneously performing a read operation of each memory cell in a second layer of the first pillar of the 3D memory cell array, the second layer being different from the first layer of the first pillar of the 3D memory cell array, wherein the simultaneously performing the read operation of each memory cell in the second layer of the first pillar of the 3D memory cell array comprises:

measuring a second read current of each memory cell in the second layer of the first pillar of the 3D memory cell array, and at least one of the following operations:

determining that a second memory cell in the second layer of the first pillar of the 3D memory cell array failed in response to the second read current of each memory cell in the second layer of the first pillar of the 3D memory cell array not being equal to a second expected read current of each memory cell in the second layer of the first pillar of the 3D memory cell array; or determining that no memory cells in the second layer of the first pillar of the 3D memory cell array failed in response to the second read current of each memory cell in the second layer of the first pillar of the 3D memory cell array being equal to the second expected read current of each memory cell in the second layer of the first pillar of the 3D memory cell array.

10. The method of claim 1, wherein the determining that the memory cell in the first pillar of the 3D memory cell array has failed comprises:

comparing a total read current of each memory cell in the first pillar of the 3D memory cell array with an expected total read current of each memory cell in the first pillar of the 3D memory cell array.

11. The method of claim 10, wherein the determining that the memory cell in the first pillar of the 3D memory cell array has failed further comprises:

determining that the total read current of each memory cell in the first pillar of the 3D memory cell array is not equal to the expected total read current of each memory cell in the first pillar of the 3D memory cell array.

12. The method of claim 1, further comprising:

simultaneously performing a third read operation of each memory cell in the first pillar of the 3D memory cell array after replacing at least one failed memory cell in the first layer of the first pillar of the 3D memory cell array with the spare memory cell.

13. A method of testing a three dimensional (3D) memory cell array, the method comprising:

applying a first voltage to word lines of each layer of memory cells in the 3D memory cell array thereby performing a write operation of the 3D memory cell array;

simultaneously performing a read operation of each memory cell in a first layer of the 3D memory cell array, wherein the simultaneously performing the read operation of each memory cell in the first layer of the 3D memory cell array comprises:

comparing a first total read current of each memory cell in the first layer of the 3D memory cell array with a first expected read current of each memory cell in the first layer of the 3D memory cell;

determining that each memory cell in the first layer of the 3D memory cell array has not failed in response to the read operation of the first layer of the 3D memory cell array; and not replacing at least one failed memory cell in the first layer of the 3D memory cell array with a first spare memory cell, in response to determining that each memory cell in the first layer of the 3D memory cell array has not failed.

14. The method of claim 13, wherein the determining that each memory cell in the first layer of the 3D memory cell array has not failed comprises:

determining that the first total read current of each memory cell in the first layer of the 3D memory cell array is equal to the first expected read current of each memory cell in the first layer of the 3D memory cell array.

15. The method of claim 13, wherein the simultaneously performing the read operation of each memory cell in the first layer of the 3D memory cell array further comprises:

enabling each row of memory cells in the first layer of the 3D memory cell array in response to the first voltage on each word line in the first layer of the 3D memory cell array;

enabling each column of memory cells in the first layer of the 3D memory cell array in response to a first bit line voltage on each bit line in the first layer of the 3D memory cell array and a first source line voltage on each source line in the first layer of the 3D memory cell array;

disabling each row of memory cells in other layers of the 3D memory cell array in response to a second word line voltage on each word line in the other layers of the 3D memory cell array, the other layers of the 3D memory cell array not including the first layer; and disabling each column of memory cells in the other layers of the 3D memory cell array in response to a second bit line voltage on each bit line in the other layers of the 3D memory cell array and a second source line voltage on each source line in the other layers of the 3D memory cell array.

16. The method of claim 13, further comprising:

simultaneously performing a read operation of each memory cell in a second layer of the 3D memory cell array, the second layer of the 3D memory cell array being different from the first layer of the 3D memory cell array;

determining whether a second memory cell in the second layer of the 3D memory cell array has failed in response to the read operation of the second layer of the 3D memory cell array; and at least one of:

replacing at least one failed memory cell in the second layer of the 3D memory cell array with a second spare memory cell, in response to determining that the second memory cell in the second layer of the 3D memory cell array has failed; or not replacing at least one failed memory cell in the second layer of the 3D memory cell array with the second spare memory cell, in response to determining that the second memory cell in the second layer of the 3D memory cell array has not failed.

17. The method of claim 16, wherein the simultaneously performing the read operation of each memory cell in the second layer of the 3D memory cell array comprises:

comparing a second read current of each memory cell in the second layer of the 3D memory cell array with a second expected read current of each memory cell in the second layer of the 3D memory cell, and at least one of:

determining that the second memory cell in the second layer of the 3D memory cell array failed in response to the second read current of each memory cell in the second layer of the 3D memory cell array not being equal to the second expected read current; or determining that the second memory cell in the second layer of the 3D memory cell array has not failed in response to the second read current of each memory cell in the second layer of the 3D memory cell array being equal to the second expected read current.

18. A memory circuit, comprising:

a first memory cell array on a first layer;

a second memory cell array on a second layer different from the first layer;

a decoder circuit coupled to the first memory cell array and the second memory cell array by a set of word lines, a set of bit lines or a set of source lines, the decoder circuit configured to simultaneously perform a write operation of each memory cell in the first layer of the first memory cell array; and a read circuit coupled to at least the first memory cell array or the second memory cell array, the read circuit being configured to simultaneously perform a read operation of each memory cell in the first layer of the first memory cell array, and configured to determine whether a memory cell in the first layer of the first memory cell array has failed in response to the read operation, wherein the read circuit configured to simultaneously perform the read operation of each memory cell in the first layer of the first memory cell array comprises the read circuit being further configured to compare a total read current of each memory cell in the first layer of the first memory cell array with an expected total read current of each memory cell in the first layer of the first memory cell array.

19. The memory circuit of claim 18, wherein the first memory cell array or the second memory cell array comprises:

an array of NOR memory cells; or an array of NAND memory cells.

20. The memory circuit of claim 18, wherein the read circuit configured to determine whether the memory cell in the first layer of the first memory cell array has failed in response to the read operation comprises:

the read circuit being further configured to determine that the total read current of each memory cell in the first layer of the first memory cell array is not equal to the expected total read current of each memory cell in the first layer of the first memory cell array.

* * * * *